United States Patent
Favreau

[11] Patent Number: 5,412,245
[45] Date of Patent: May 2, 1995

[54] SELF-ALIGNED VERTICAL ANTIFUSE
[75] Inventor: David P. Favreau, Coopersburg, Pa.
[73] Assignee: AT&T Corp., Murray Hill, N.J.
[21] Appl. No.: 247,617
[22] Filed: May 23, 1994

Related U.S. Application Data
[63] Continuation of Ser. No. 991,790, Dec. 17, 1992, abandoned.
[51] Int. Cl.⁶ .................... H01L 45/00; H01L 27/02
[52] U.S. Cl. ........................ 257/530; 257/50; 257/751; 257/763; 437/195; 437/922
[58] Field of Search .......... 257/530, 50, 751, 763; 437/195, 922

[56] References Cited

U.S. PATENT DOCUMENTS
| | | | |
|---|---|---|---|
| 4,271,424 | 6/1981 | Inayoshi et al. | 257/754 |
| 4,424,578 | 1/1984 | Miyamoto | 257/530 |
| 4,943,538 | 9/1990 | Mohsen et al. | 257/530 |
| 4,949,084 | 8/1990 | Schwartz et al. | 257/530 |
| 5,100,827 | 3/1992 | Lytle | 437/52 |
| 5,134,457 | 7/1992 | Hamdy et al. | 257/530 |
| 5,171,715 | 12/1992 | Husher et al. | 257/530 |

FOREIGN PATENT DOCUMENTS
| | | | |
|---|---|---|---|
| 61-156762 | 7/1986 | Japan | 257/763 |
| 0325234 | 7/1989 | Japan | H01L 23/52 |

OTHER PUBLICATIONS
European Search Report dated 30 Mar. 1994.

*Primary Examiner*—J. Carroll
*Attorney, Agent, or Firm*—Richard D. Laumann

[57] ABSTRACT

An integrated circuit has a plurality of programmable antifuses. Each antifuse can be programmed to connect metals runners on one level with either or both of a pair of runners on a second level.

5 Claims, 2 Drawing Sheets

SELF-ALIGNED VERTICAL ANTIFUSE

This application is a continuation of application Ser. No. 07/991,790, filed Dec. 17, 1992, abandoned.

TECHNICAL FIELD

This invention relates generally to integrated circuits having antifuses and particularly to such integrated circuits having self aligned vertical antifuses.

BACKGROUND OF THE INVENTION

There are many integrated circuits manufactured with programmable devices or features; that is, the user may alter the electrical characteristics of the integrated circuit to satisfy the user's needs. The features may be such that they may be altered many times; that is, they may be programmable, or they may be alterable only a single time. Programmable devices offer more versatility, but typically lose their programming information if the applied voltage is removed. Single time programmable devices retain information when the applied voltage is removed but are typically programmed in a destructive manner. They thus retain the programmed information, but, if programmed with the incorrect information, may become useless.

The programming may change a device from a low resistance state to a high resistance state or it may change a device from a high resistance state to a low resistance state. The former device is the well known fuse, and the latter device is now termed an antifuse. A typical antifuse, in the unprogrammed state, has a nonconducting region of, for example, amorphous silicon between two conducting regions. The amorphous silicon has a very high resistance and there is minimal conduction between the two conducting regions. When a sufficiently high voltage, termed a programming voltage, is applied between the two conducting regions, the amorphous silicon changes to a low resistance state. The conducting regions may be aluminum and there may be a barrier layer of, for example, TiN, between either or both of the aluminum regions and the amorphous silicon. There may also be a metal layer of, for example, Ti between the TiN and the amorphous silicon. The programming voltage creates a conducting path through the amorphous silicon. The programming voltage is proportioned to the thickness of the amorphous silicon since breakdown occurs at a specific electric field. The thickness of the amorphous silicon layer must be carefully controlled so that programming is accurately performed.

Many configurations are possible for the antifuse. One configuration is the vertical antifuse is frequently preferred because it establishes an electrically conducting path through a via or window. See, for example, U.S. Pat. No. 5,100,827, issued on Mar. 31, 1992 to Steven A. Lytle, for a description of a vertical antifuse. The vertical antifuse is frequently preferred because it requires less area than does a horizontal antifuse. One configuration of the vertical antifuse has an aluminum interconnect covered by a dielectric layer. This dielectric layer is patterned to form vias which expose portions of the interconnect, and then layers of barrier material, amorphous silicon and aluminum are deposited. This configuration works well for many uses, but consideration of its structure shows that a via must be etched for each aluminum interconnect.

It would be desirable to effectively decrease the surface area needed by the circuit by reducing the numbers of vias that must be used per interconnect.

SUMMARY OF THE INVENTION

An integrated circuit has a plurality of antifuses which can be used to electrically contact either or both of a pair of interconnects. The circuit has a plurality of interconnect pairs, each of which has a conducting surface, a layer of amorphous silicon, a barrier layer, a patterned dielectric layer which has at least one window that exposes portions of the uppermost of the amorphous silicon and barrier layers, and a layer of aluminum. Portions of the silicon and barrier layers, and aluminum are in the window. The silicon and barrier layers cover the substrate surface between the pair of interconnects. Application of a suitable programming voltage creates an electrically conducting path to either or both of the interconnects. In a preferred embodiment, the aluminum runners have a cladding layer of, for example, tungsten which increases the area available for the contact.

BRIEF DESCRIPTION OF THE DRAWINGS

For reasons of clarity, the elements depicted are not drawn to scale. Identical numerals in different figures represent identical elements.

DETAILED DESCRIPTION

Figure 1:
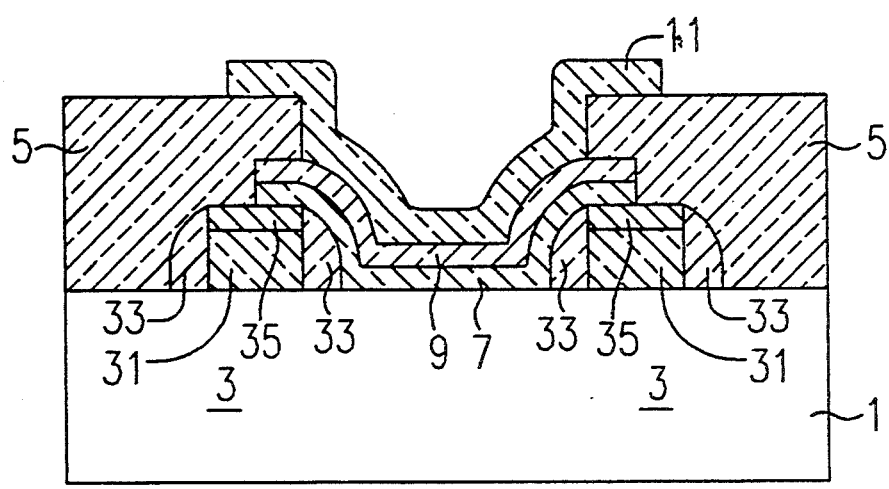
FIGS. 1–3 are sectional views of a self-aligned vertical antifuse according to the invention.

The invention will be described by reference to a particular embodiment and another embodiment will be briefly described. FIG. 1 depicts substrate 1, a pair of interconnects 3, patterned dielectric layer 5, amorphous silicon layer 7, barrier layer 9, and metal 11. The interconnects comprise, for example, aluminum conductor 31, spacers 33, and conducting top layer 35. The barrier layer 9 is, for example, TiN. The metal 11 is, for example, aluminum. The substrate 1 is typically a dielectric. The spacers may comprise an insulating material which prevents a reaction between the amorphous silicon and the conducting portion of the interconnect. The silicon and barrier layers cover the substrate between the interconnect pair.

The structure will be readily fabricated by those skilled in the art. The dielectric 5 will be readily fabricated as will the transistors and other devices (not shown for reasons of clarity) in the integrated circuit. In particular, the metal for the conductor 31 is deposited and patterned. The material for the spacers is deposited and etched back leaving the spacers 33. Amorphous silicon and barrier material are deposited to form layers 7 and 9. These materials are typically blanket deposited and then patterned to cover the area between the interconnects and a substantial portion of the tops of the interconnects. A dielectric layer is then deposited and patterned to form windows which expose selected portions of the uppermost of the patterned barrier layer and amorphous silicon. The amorphous silicon is not deposited into the window, and there is good control of layer thickness. A conducting material, such as aluminum, is then deposited and patterned to fill portions of the window.

Programming is performed by applying a voltage between metal 11 and either or both of the interconnect pair, but probably not simultaneously. The other contacts to the interconnect pairs are not shown. Appropriate polarities will be readily selected as will suitable programming voltages. As will now be appreciated, the antifuse may be programmed separately to establish electrical connection to either one or to both of the runners of the pair although only one via or window has to be opened in the dielectric 5.

Although, as will be discussed later, the structure described saves a considerable amount of substrate area, there are two possible areas where care is needed during processing. First, the amorphous silicon and the barrier layer have to be patterned carefully. The electrical connection is formed through the top of the conducting layer of the interconnects and is relatively small. Misalignment during patterning may create an undesirably small area. The small area may change either or both the programming voltage and ON state resistance from the nominal values. Second, an overetch during sidewall formation may create sidewalls that are too small and lead to undesired reactions between the aluminum and the amorphous silicon.

Figure 2:
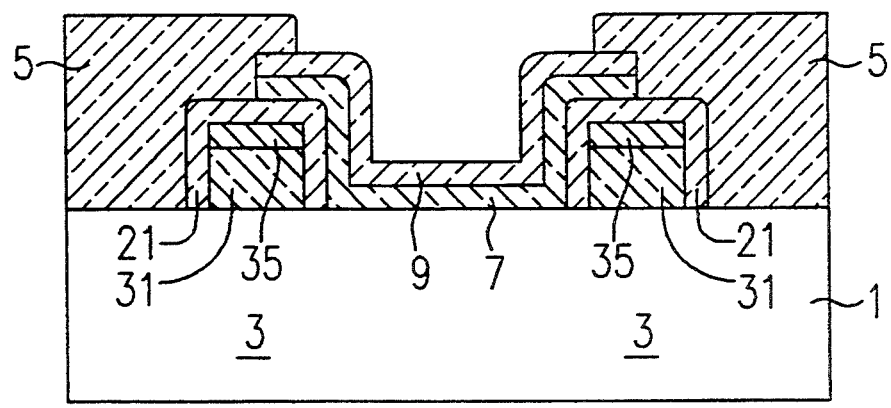
Figure 3:
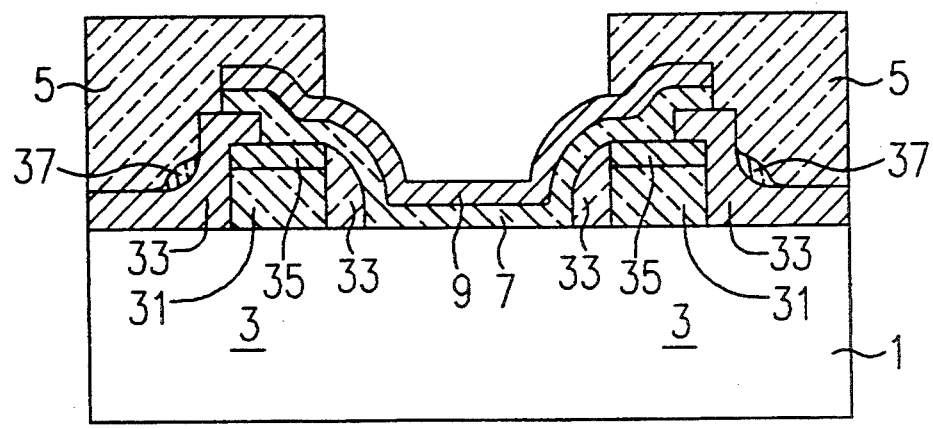

Another embodiment is depicted in sectional view in FIG. 2. It is similar to the previous embodiment except that the runner has been encapsulated with a metal cladding layer 21. A suitable metal is tungsten which can be deposited on aluminum by selective chemical vapor deposition. The tungsten acts as a barrier layer and simultaneously increases the contact area. Dielectric sidewalls are not needed in this embodiment. Yet another embodiment is depicted in FIG. 3. This embodiment patterns a dielectric layer to expose portions of the runners and then deposits and patterns the amorphous silicon and the metal layers. The dielectric layer 5 is then deposited and patterned to form windows, etc. Because the amorphous silicon/metal terminates on a dielectric, the structure may be subject to an overetch of the amorphous silicon/barrier stack to remove metal stringers 37.

Figure 4:
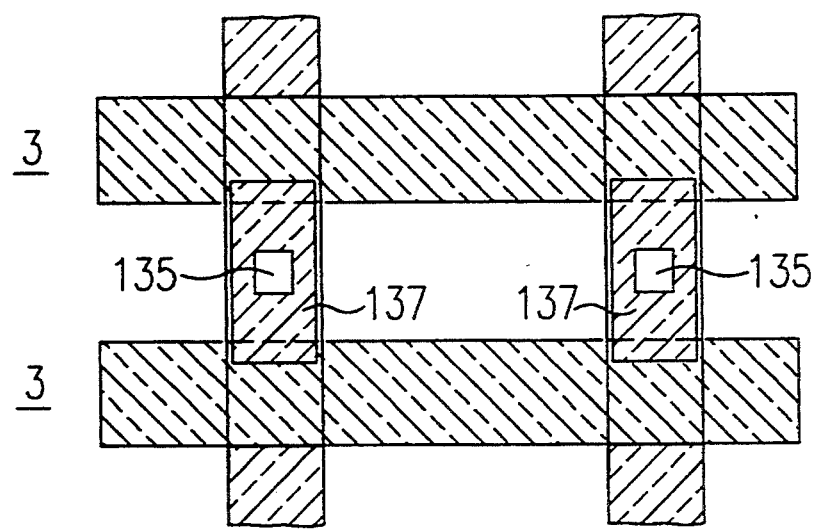
FIG. 4 is a top view of antifuses according to this invention.

That substrate area is saved through this structure is better appreciated by consideration of FIG. 4 which is a top view of a cell, according to this invention, having 4 bits. The cell is not drawn to the scale of FIG. 1. Depicted are metal 1 runners 3, metal 2 runners 23, vias 135 and two antifuses 137. The antifuses are used to selectively connect metal 1 and metal 2 runners. The prior art required one antifuse at each intersection of metal 1 and metal 2 runners. The configuration of this invention requires half as many antifuses, thereby saving significant substrate area.

Variations of the embodiment described will be readily thought of by those skilled in the art. The antifuses may be used to selectively connect interconnects on any two adjacent metal levels. There may also be a metal layer in addition to the barrier layer.

I claim:
1. An integrated circuit comprising:
a plurality of electrically conducting interconnect pairs, there being area between said pairs, each of which has a conducting surface;
a layer of amorphous silicon and a layer of a barrier material, said layers covering the area between said interconnect pairs and contacting at least portions of the surfaces of said interconnect pairs;
a patterned dielectric layer which has windows which expose portions of the uppermost of said layer of amorphous silicon and said layer of barrier material, there being only one window per pair of electrically conducting interconnect pairs; and
a layer of metal in said windows.
2. An integrated circuit as recited in claim 1 further comprising:
a plurality of cladding layers which encapsulate said electrically conducting interconnect pairs.
3. An integrated circuit as recited in claim 2 in which said cladding layers comprise tungsten.
4. An integrated circuit as recited in claim 1 in which said layers of amorphous silicon and barrier material are patterned.
5. An integrated circuit as recited in claim 1 in which said electrically conducting interconnect pairs comprise dielectric sidewalls.

* * * * *